United States Patent
Liu et al.

(10) Patent No.: US 8,158,032 B2
(45) Date of Patent: Apr. 17, 2012

(54) SILVER NANOPARTICLE INK COMPOSITION FOR HIGHLY CONDUCTIVE FEATURES WITH ENHANCED MECHANICAL PROPERTIES

(75) Inventors: Ping Liu, Mississauga (CA); Yiliang Wu, Mississauga (CA); Nan-Xing Hu, Oakville (CA)

(73) Assignee: Xerox Corporation, Norwalk, CT (US)

( * ) Notice: Subject to any disclaimer, the term of this patent is extended or adjusted under 35 U.S.C. 154(b) by 0 days.

(21) Appl. No.: 12/860,207

(22) Filed: Aug. 20, 2010

(65) Prior Publication Data

US 2012/0043512 A1    Feb. 23, 2012

(51) Int. Cl.
*H01B 1/22* (2006.01)
*B05D 5/12* (2006.01)

(52) U.S. Cl. ........ 252/514; 427/58; 427/96.1; 427/98.4; 427/99.2

(58) Field of Classification Search .................. 252/514; 427/58, 96.1, 98.4, 99.2
See application file for complete search history.

(56) References Cited

U.S. PATENT DOCUMENTS

| | | | |
|---|---|---|---|
| 6,107,117 A | 8/2000 | Bao et al. | |
| 7,270,694 B2 | 9/2007 | Li et al. | |
| 2003/0136958 A1 | 7/2003 | Ong et al. | |
| 2003/0160230 A1 | 8/2003 | Ong et al. | |
| 2003/0160234 A1 | 8/2003 | Ong et al. | |
| 2006/0083694 A1* | 4/2006 | Kodas et al. | 424/46 |
| 2006/0159603 A1* | 7/2006 | Vanheusden et al. | 423/1 |
| 2006/0189113 A1* | 8/2006 | Vanheusden et al. | 438/597 |
| 2007/0014925 A1* | 1/2007 | Mues | 427/355 |
| 2007/0034052 A1* | 2/2007 | Vanheusden et al. | 75/362 |
| 2007/0099357 A1 | 5/2007 | Li et al. | |
| 2007/0290175 A1* | 12/2007 | Kim | 252/500 |
| 2009/0148600 A1 | 6/2009 | Li et al. | |
| 2009/0162557 A1 | 6/2009 | Lu et al. | |
| 2009/0181183 A1 | 7/2009 | Smith et al. | |
| 2009/0242826 A1 | 10/2009 | Harada et al. | |
| 2010/0237522 A1* | 9/2010 | Enomura | 264/8 |
| 2010/0247870 A1* | 9/2010 | Suzuki et al. | 428/172 |
| 2011/0209751 A1* | 9/2011 | Nojiri et al. | 136/256 |

FOREIGN PATENT DOCUMENTS

KR    2006055256 A  *  5/2006

OTHER PUBLICATIONS

CAS reg. No. 68648-78-2, Nov. 16, 1984.*

* cited by examiner

*Primary Examiner* — Douglas McGinty
(74) *Attorney, Agent, or Firm* — Oliff & Berridge, PLC

(57) ABSTRACT

A conductive ink composition comprising organic-stabilized silver nanoparticles and a solvent, and a polyvinyl alcohol derivative resin of Formula (1)

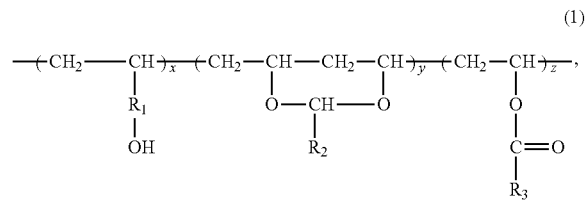

wherein $R_1$ is a chemical bond or a divalent hydrocarbon linkage having from about 1 to about 20 carbons; $R_2$ and $R_3$ are independently an alkyl, an aromatic or substituted aromatic group having from about 1 to about 20 carbon atoms; x, y and z represent the proportion of the corresponding repeat units respectively expressed as a weight percent, wherein each repeat unit is randomly distributed along polymer chain, and the sum of x, y and z is about 100 weight percent, and wherein the polyvinyl alcohol derivative resin is present in an amount of from 0.1 to about 5 weight percent of the ink composition.

20 Claims, 3 Drawing Sheets

SILVER NANOPARTICLE INK COMPOSITION FOR HIGHLY CONDUCTIVE FEATURES WITH ENHANCED MECHANICAL PROPERTIES

BACKGROUND

Fabrication of electronic circuit elements using liquid deposition techniques is of profound interest as such techniques provide potentially low-cost alternatives to conventional mainstream amorphous silicon technologies for electronic applications such as thin film transistors (TFTs), light-emitting diodes (LEDs), RFID tags, photovoltaics, and the like. However the deposition and/or patterning of functional electrodes, pixel pads, and conductive traces, lines and tracks, which meet the conductivity, processing, and cost requirements for practical applications have been a great challenge.

Solution-processable conductors are of great interest for use in such electronic applications. Silver nanoparticle-based inks represent a promising class of materials for printed electronics. However, most silver (and gold) nanoparticles often require large molecular weight stabilizers to ensure proper solubility and stability in solution. These large molecular weight stabilizers inevitably raise the annealing temperatures of the silver nanoparticles above 200° C. in order to burn off the stabilizers, which temperatures are incompatible with most low-cost plastic substrates such as polyethylene terephthalate (PET) and polyethylene naphthalate (PEN) that the solution may be coated onto and can cause damage thereto.

Furthermore, current silver nanoparticle compositions may have adhesion issues with some substrates. Simply rubbing and/or contacting the surface of the printed silver features may thus inevitably damage the printed features from such silver nanoparticle compositions. Thus, the poor adhesion of the silver nanoparticle composition may limit its use in certain applications, such as, for example, printed antennas.

SUMMARY

There is therefore a need for conductive silver nanoparticle compositions with improved adhesion to a substrate, for example, wherein the silver nanoparticle composition cannot be removed from the substrate by peeling the silver nanoparticles using an adhesive tape.

The above and other issues are addressed by the present application, wherein in embodiments, the application relates to a conductive ink composition comprising organic-stabilized silver nanoparticles and a solvent, and a polyvinyl alcohol derivative resin of Formula (1)

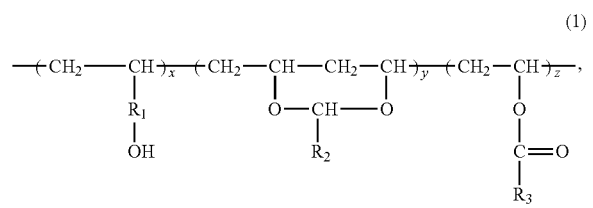

wherein $R_1$ is a chemical bond or a divalent hydrocarbon linkage having from about 1 to about 20 carbons; $R_2$ and $R_3$ are independently an alkyl, an aromatic or substituted aromatic group having from about 1 to about 20 carbon atoms; x, y and z represent the proportion of the corresponding repeat units respectively expressed as a weight percent, wherein each repeat unit is randomly distributed along polymer chain, and the sum of x, y and z is of about 100 weight percent, and wherein the polyvinyl alcohol derivative resin is present in an amount of from 0.1 to about 5 weight percent of the ink composition.

In embodiments, described is a conductive ink composition comprising a silver nanoparticle solution including organic-stabilized silver nanoparticles, a solvent, and a polyvinyl alcohol derivative resin of Formula (1)

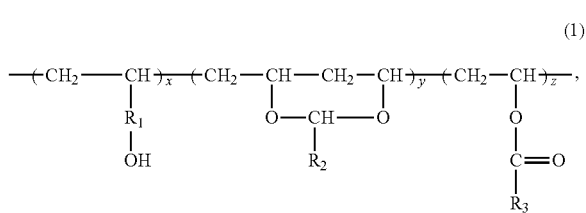

wherein $R_1$ is a chemical bond or a divalent hydrocarbon linkage having from about 1 to about 20 carbons; $R_2$ and $R_3$ are independently an alkyl, an aromatic or substituted aromatic group having from about 1 to about 20 carbon atoms; x, y and z represent the proportion of the corresponding repeat units respectively expressed as a weight percent, wherein each repeat unit is randomly distributed along polymer chain, and the sum of x, y and z is about 100 weight percent, wherein the polyvinyl alcohol derivative resin is present in an amount of from 0.1 to about 5 weight percent of the ink composition, and wherein the viscosity of the silver ink composition is from about 2 cps to about 200 cps.

In further embodiments, described is a method of forming conductive features on a substrate, the method comprising: providing a silver ink composition comprised of a silver nanoparticle particle solution including organic-stabilized silver nanoparticles, a solvent and polyvinyl alcohol derivative resin of Formula (1)

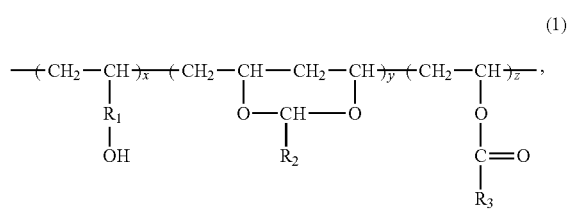

wherein $R_1$ is a chemical bond or a divalent hydrocarbon linkage having from about 1 to about 20 carbons; $R_2$ and $R_3$ are independently an alkyl, an aromatic or substituted aromatic group having from about 1 to about 20 carbon atoms; x, y and z represent the proportion of the corresponding repeat units respectively expressed as a weight percent, wherein each repeat unit is randomly distributed along polymer chain, and the sum of x, y and z is about 100 weight percent, wherein the polyvinyl alcohol derivative resin is present in an amount of from 0.1 to about 5 weight percent of the silver ink composition, and wherein the viscosity of the silver ink composition is from about 2 cps to about 200 cps, depositing the silver ink composition onto the substrate to form deposited features, and heating the deposited features on the substrate to a temperature from about 80° C. to about 160° C. to form conductive silver features on the substrate.

DETAILED DESCRIPTION OF EMBODIMENTS

Figure 1:
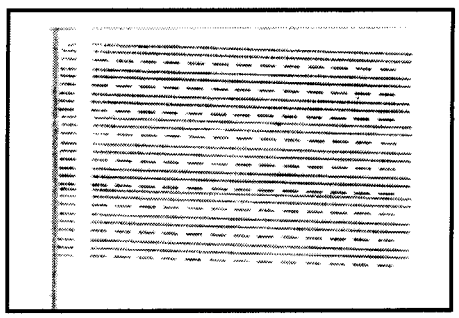
FIG. 1 is a photograph of the printed conductive line of Example 1 before the tape is applied.

Described herein is an ink composition containing stabilized silver nanoparticles and exhibiting improved adhesion to the surface of a substrate. The ink composition is comprised of a silver nanoparticle solution that may contain a silver nanoparticles, a stabilizer and a solvent. The ink composition may also contain a PVB resin. After the ink composition is printed onto a substrate, the substrate is annealed to form conductive silver features on the substrate.

Silver Nanoparticles

The term "nano" as used in "silver nanoparticles" refers to, for example, a particle size of less than about 1,000 nm, such as, for example, from about 0.5 nm to about 1,000 nm, for example, from about 1 nm to about 500 nm, from about 1 nm to about 100 nm, from about 1 nm to about 25 nm or from about 1 to about 10 nm. The particle size refers to the average diameter of the metal particles, as determined by TEM (transmission electron microscopy) or other suitable method. Generally, a plurality of particle sizes may exist in the silver nanoparticles obtained from the process described herein. In embodiments, the existence of different sized silver nanoparticles is acceptable.

The silver nanoparticles may have a stability (that is, the time period where there is minimal precipitation or aggregation of the silver nanoparticles in the ink composition) of, for example, at least from about 5 days to about 1 month, from about 1 week to about 6 months, from about 1 week to over 1 year. The stability can be monitored using a variety of methods, for example, a dynamic light scattering method that probes the particle size, a simple filtration method using a determined filter pore size, for example 1 micron, to evaluate the solid on the filter.

Additional metal nanoparticles in place of, or along with the, silver nanoparticles may also be used, such as, for example, Al, Au, Pt, Pd, Cu, Co, Cr, In, and Ni, particularly the transition metals, for example, Au, Pt, Pd, Cu, Cr, Ni, and mixtures thereof. Furthermore, the ink composition may also include a silver nanoparticle composite or a metal nanoparticle composite, such as, for example, Au—Ag, Ag—Cu, Ag—Ni, Au—Cu, Au—Ni, Au—Ag—Cu, and Au—Ag—Pd. The composites may also include non-metals, such as, for example, Si, C, and Ge. The various components of the composites may be present in an amount ranging for example from about 0.01% to about 99.9% by weight, particularly from about 10% to about 90% by weight.

The weight percentage of the silver nanoparticles in the ink composition may be from, for example, about 10 weight percent to about 80 weight percent, from about 30 weight percent to about 60 weight percent or from about 40 weight percent to about 70 weight percent.

The ink composition described herein contains a stabilizer that is associated with the surface of the silver nanoparticles and is not removed until the annealing of the silver nanoparticles during formation of metal features on a substrate. The stabilizer may be organic.

In embodiments, the stabilizer is physically or chemically associated with the surface of the silver nanoparticles. In this way, the silver nanoparticles have the stabilizer thereon outside of a liquid solution. That is, the nanoparticles with the stabilizer thereon may be isolated and recovered from a reaction mixture solution used in forming the nanoparticles and stabilizer complex. The stabilized nanoparticles may thus be subsequently readily and homogeneously dispersed in a solvent for forming a printable liquid.

As used herein, the phrase "physically or chemically associated" between the silver nanoparticles and the stabilizer may be a chemical bond and/or other physical attachment. The chemical bond may take the form of, for example, covalent bonding, hydrogen bonding, coordination complex bonding, or ionic bonding, or a mixture of different chemical bonds. The physical attachment may take the form of, for example, van der Waals' forces or dipole-dipole interaction, or a mixture of different physical attachments.

The term "organic" in "organic stabilizer" refers to, for example, the presence of carbon atom(s), but the organic stabilizer may include one or more non-metal heteroatoms such as nitrogen, oxygen, sulfur, silicon, halogen, and the like. The organic stabilizer may be an organoamine stabilizer such as those described in U.S. Pat. No. 7,270,694, which is incorporated by reference herein in its entirety. Examples of the organoamine are an alkylamine, such as for example butylamine, pentylamine, hexylamine, heptylamine, octylamine, nonylamine, decylamine, hexadecylamine, undecylamine, dodecylamine, tridecylamine, tetradecylamine, diaminopentane, diaminohexane, diaminoheptane, diaminooctane, diaminononane, diaminodecane, diaminooctane, dipropylamine, dibutylamine, dipentylamine, dihexylamine, diheptylamine, dioctylamine, dinonylamine, didecylamine, methylpropylamine, ethylpropylamine, propylbutylamine, ethylbutylamine, ethylpentylamine, propylpentylamine, butylpentylamine, tributylamine, trihexylamine, and the like, or mixtures thereof.

Examples of other organic stabilizers include, for example, thiol and its derivatives, —OC(=S)SH (xanthic acid), polyethylene glycols, polyvinylpyridine, polyninylpyrolidone, and other organic surfactants. The organic stabilizer may be selected from the group consisting of a thiol such as, for example, butanethiol, pentanethiol, hexanethiol, heptanethiol, octanethiol, decanethiol, and dodecanethiol; a dithiol such as, for example, 1,2-ethanedithiol, 1,3-propanedithiol, and 1,4-butanedithiol; or a mixture of a thiol and a dithiol. The organic stabilizer may be selected from the group consisting of a xanthic acid such as, for example, O-methylxanthate, O-ethylxanthate, O-propylxanthic acid, O-butylxanthic acid, O-pentylxanthic acid, O-hexylxanthic acid, O-heptylxanthic acid, O-octylxanthic acid, O-nonylxanthic acid, O-decylxanthic acid, O-undecylxanthic acid, O-dodecylxanthic acid. Organic stabilizers containing a pyridine derivative (for example, dodecyl pyridine) and/or organophosphine that can stabilize metal nanoparticles may also be used as a potential stabilizer.

Further examples of stabilized silver nanoparticles may include: the carboxylic acid-organoamine complex stabilized silver nanoparticles, described in U.S. Patent Application Pub. No. 2009/0148600; the carboxylic acid stabilizer silver nanoparticles described in U.S. Patent App. Pub. No. 2007/0099357 A1, and the thermally removable stabilizer and the UV decomposable stabilizers described in U.S. Patent Application Pub. No. 2009/0181183, each of which is incorporated by reference herein in its entirety.

The extent of the coverage of stabilizer on the surface of the silver nanoparticles may vary, for example, from partial to full coverage depending on the capability of the stabilizer to stabilize the silver nanoparticles. Of course, there is variability as well in the extent of coverage of the stabilizer among the individual silver nanoparticles.

The weight percentage of the organic stabilizer in the silver nanoparticle (including only the silver nanoparticle and the stabilizer, excluding the solvent) may be from, for example, about 3 weight percent to about 80 weight percent, from about 5 weight percent to about 60 weight percent, from about 10 weight percent to about 50 weight percent, or from about 10 weight percent to about 30 weight percent.

In embodiments, the silver nanoparticle is an organoamine stabilized silver nanoparticle. The weight percentage of silver in the silver nanoparticle (silver and stabilizer only) is from about 60% to about 95% or from about 70% to about 90%. The weight percentage of the silver nanoparticles in the silver nanoparticle solution (including the solvent) is from about 20% to about 80%, including from about 30% to about 80%. The weight percentage of the silver nanoparticles in the silver ink composition may be from about 10% to about 80%, from about 30% to about 70% and from about 40% to about 60%.

Solvent

The solvent should facilitate the dispersion of the stabilized silver nanoparticles and the polyvinyl alcohol derivative resins. Examples of the solvent may include, for example, aromatic hydrocarbons such as benzene, toluene, xylene, ethylbenzene, decalin and tetralin, an alkane, alkene or an alcohol having from about 10 to about 18 carbon atoms such as, undecane, dodecane, tridecane, tetradecane, hexadecane, hexadecane, 1-undecanol, 2-undecanol, 3-undecanol, 4-undecanol, 5-undecanol, 6-undecanol, 1-dodecanol, 2-dodecanol, 3-dodecanol, 4-dodecanol, 5-dodecanol, 6-dodecanol, 1-tridecanol, 2-tridecanol, 3-tridecanol, 4-tridecanol, 5-tridecanol, 6-tridecanol, 7-tridecanol, 1-tetradecanol, 2-tetradecanol, 3-tetradecanol, 4-tetradecanol, 5-tetradecanol, 6-tetradecanol, 7-tetradecanol, and the like; an alcohol, such as for example, terpineol (α-terpineol), β-terpineol, geraniol, cineol, cedral, linalool, 4-terpineol, lavandulol, citronellol, nerol, methol, borneol, hexanol heptanol, cyclohexanol, 3,7-dimethylocta-2,6-dien-1ol, 2-(2-propyl)-5-methyl-cyclohexane-1-ol and the like; isoparaffinc hydrocarbons, such as, for example, isodecane, isododecane, and commercially available mixtures of isoparaffins such as ISOPAR E, ISOPAR G, ISOPAR H, ISOPAR L and ISOPAR M (all the above-mentioned manufactured by Exxon Chemical Company), SHELLSOL (made by Shell Chemical Company), SOLTROL (made by Philips Oil Co., Ltd.), BEGASOL (made by Mobil Petroleum Co., Inc.) and IP Solvent 2835 (made by Idemitsu Petrochemical Co., Ltd.); naphthenic oils; tetrahydrofuran; chlorobenzene; dichlorobenzene; trichlorobenzene; nitrobenzene; cyanobenzene; acetonitrile; dichloromethane; N,N-dimethylformamide (DMF); and mixtures thereof. One, two, three or more solvents may be used.

In embodiments where two or more solvents are used, each solvent may be present at any suitable volume ratio or weight ratio such as for example from about 99 (first solvent):1 (second solvent) to about 1 (first solvent):99 (second solvent), including the volume ratio or weight molar ratio from about 80 (first solvent):20 (second solvent) to about 20 (first solvent):80 (second solvent). For example, the solvent may a mixture comprised of a solvent selected from the group consisting of terpineol, hexanol, heptanol, cyclohexanol, 3,7-dimethylocta-2,6-dien-1ol, 2-(2-propyl)-5-methyl-cyclohexane-1-ol, and the like, and at least one hydrocarbon solvent selected from the group consisting of decalin, hexadecane, hexadecene, 1,2,4-trimethylbenzene.

The solvent may be present in the silver ink composition in an amount of at least 10 weight percent of the composition, such as for example from about 10 weight percent to about 90 weight percent, from about 20 weight percent to about 80 weight percent, from about 30 weight percent to about 70 weight percent and from about 40 weight percent to about 60 weight percent of the composition.

Polyvinyl Alcohol Derivative Resins

The silver ink composition further comprises at least one polyvinyl alcohol derivative resin. The polyvinyl alcohol derivative resin acts as an adhesion promoter to facilitate its adhesion to a wide variety of substrates and also increases the stability of ink composition, such as by extending the shelf life of the ink composition. Furthermore, the polyvinyl alcohol derivative resin must be compatible with jettability and stability requirements for the ink formation.

In embodiments, the polyvinyl alcohol derivative resin may be represented by formula (1)

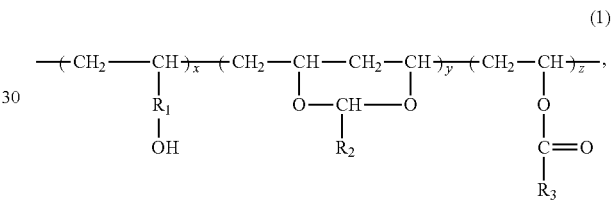

wherein $R_1$ is a chemical bond, such as a covalent chemical bond, or a divalent hydrocarbon linkage having from about 1 to about 20 carbons, from about 1 to about 15 carbon atoms, from about 4 to about 12 carbon atoms, from about 1 to about 10 carbon atoms, from about 1 to about 8 carbon atoms or from about 1 to about 4 carbon atoms; $R_2$ and $R_3$ are independently an alkyl group, such as a methyl, ethyl, propyl, butyl, pentyl, hexyl and heptyl groups, an aromatic group or a substituted aromatic group having from about 1 to about 20 carbon atoms, from about 1 to about 15 carbon atoms, from about 4 to about 12 carbon atoms, from about 1 to about 10 carbon atoms, from about 1 to about 8 carbon atoms or from about 1 to about 4 carbon atoms; x, y and z represent the proportion of the corresponding repeat units respectively expressed as a weight percent, wherein each repeat unit is randomly distributed along polymer chain, and the sum of x, y and z is about 100 weight percent; x is independently from about 3 weight percent to about 50 weight percent, from about 5 weight percent to about 40 weight percent, from about 5 weight percent to about 25 weigh percent and from about 5 weight percent to about 15 weight percent; y is independently from about 50 weight percent to about 95 weight percent, from about 60 weight percent to about 95 weight percent, from about 75 weight percent to about 95 weight percent and from about 80 weight percent to about 85 weight percent; z is independently from about 0 weight percent to about 15 weight percent, from about 0 weight percent to about 10 weight percent, from about 0 weight percent to about 5 weight percent and from about 0 weight percent to about 3 weight percent. The polyvinyl alcohol derivative resin of Formula 1 may be derived from a polyvinyl alcohol and vinyl acetate and has a molecular weight (Mw) of about 10,000 to about 600, 000 Daltons (Da), from about 40,000 to about 300,000 Da and from about 50,000 to abut 250,000 Da. A representative composition of the polyvinyl alcohol derivative resin constitutes, on a weight basis, about 11 to 25% hydroxyl groups, calculated as polyvinyl alcohol, 0 to 2.5% acetate groups calculated as polyvinylacetate, with the balance being vinyl butyral groups.

Examples of polyvinyl alcohol derivative resins such as polyvinyl butyral resins (PVB) include those resins manufactured under the trade name MOWITAL (Kuraray America), S-LEC (Sekisui Chemical Company), BUTVAR (Solutia, Inc.), and PIOLOFORM (Wacker Chemical Company).

The polyvinyl alcohol derivative resin may be in the form of a powder or pellet, and may be produced by the methods described in WO 2008/030907, which is incorporated by reference herein in its entirety. For example, PVB resin powder can be produced by using a vinyl alcohol-based polymer, such as polyvinyl alcohol (PVA), as a raw material and butyralizing it.

Vinyl alcohol-based polymer, such as PVA, may be produced by saponifying a polymer obtained by polymerizing a vinyl ester-based monomer. Methods for polymerizing a vinyl ester-based monomer include solution polymerization, bulk polymerization, suspension polymerization, and emulsion polymerization. For the polymerization, azo-type initiators, peroxide-type initiators, redox-type initiators, or the like can be selected appropriately as a polymerization initiator depending on the polymerization method.

As the vinyl ester-based monomer, for example, vinyl formate, vinyl acetate, vinyl propionate, vinyl butyrate, vinyl isobutyrate, vinyl pivalate, vinyl versatate, vinyl caproate, vinyl caprylate, vinyl laurylate, vinyl palmitate, vinyl stearate, vinyl oleate, vinyl benzoate, and the like may be used.

When polymerizing the above vinyl ester-based monomer, another monomer may be copolymerized. Examples of these additional monomers may include for example, α-olefins such as ethylene, propylene, n-butene, and isobutylene; acrylic acid or salts thereof; acrylates such as methyl acrylate, ethyl acrylate, n-propyl acrylate, i-propyl acrylate, n-butyl acrylate, i-butyl acrylate, t-butyl acrylate, 2-ethylhexyl acrylate, dodecyl acrylate, and octadecyl acrylate; methacrylic acid or salts thereof, methacrylates such as methyl methacrylate, ethyl methacrylate, n-propyl methacrylate, i-propyl methacrylate, n-butyl methacrylate, i-butyl methacrylate, t-butyl methacrylate, 2-ethylhexyl methacrylate, dodecyl methacrylate, and octadecyl methacrylate; acrylamide, or acrylamide derivatives such as N-methyl acrylamide, N-ethyl acrylamide, N,N-dimethyl acrylamide, diacetone acrylamide, acrylamide propane sulfonic acid and salts thereof, acrylamide propyldimethylamine and acid salts thereof as well as quaternary salts thereof, and N-methylol acrylamide and derivatives thereof, methacrylamide or methacrylamide derivatives such as N-methyl methacrylamide, N-ethyl methacrylamide, methacrylamide propane sulfonic acid and salts thereof, methacrylamide propyldimethylamine and acid salts thereof as well as quaternary salts thereof, and N-methylol methacrylamide and derivatives thereof vinyl ethers such as methyl vinyl ether, ethyl vinyl ether, n-propyl vinyl ether, i-propyl vinyl ether, n-butyl vinyl ether, i-butyl vinyl ether, t-butyl vinyl ether, dodecyl vinyl ether, and stearyl vinyl ether; nitriles such as acrylonitrile, and methacrylonitrile; vinyl halides such as vinyl chloride, and vinyl fluoride; vinylidene halides such as vinylidene chloride, and vinylidene fluoride; allyl compounds such as allyl acetate, and allyl chloride; maleic acid and salts thereof as well as esters thereof and anhydrides thereof, vinylsilyl compounds such as vinyltrimethoxysilane; and isopropenyl acetate or the like, may be used. These monomers may be used at a ratio of about 5 mole % to about 90 mole % with respect to the vinyl ester-based monomer.

A vinyl alcohol-based polymer obtained by saponifying a polymer obtained by polymerizing a vinyl ester-based monomer includes a vinyl alcohol unit and a vinyl ester unit derived from the above vinyl ester-based monomer, although the content ratio for each unit is different depending on the degree of the saponification. For example, when using vinyl acetate as a vinyl ester-based monomer, the vinyl alcohol-based polymer obtained by the above production method includes a vinyl alcohol unit and a vinyl acetate unit.

Butyralization of a vinyl alcohol-based polymer may be carried out by any known method. For example, a vinyl alcohol-based polymer and butyl aldehyde may be mixed in the presence of an acid catalyst. The acid catalyst may be an organic acid or inorganic acid. Examples of the acid catalyst include acetic acid, p-toluenesulfonic acid, nitric acid, sulfuric acid, and hydrochloric acid.

Although a PVB resin may be obtained by butyralizing a vinyl alcohol-based polymer with n-butyl aldehyde, aldehydes having a carbon number of 2 to 6 other than butyl aldehyde, such as acetaldehyde, propionaldehyde, n-hexylaldehyde, and 2-ethylbutylaldehyde, can be used in combination.

The polyvinyl alcohol derivative resin may be present in the ink composition in an amount of less than 5 weight percent of the composition, such as for example from about 0.1 weight percent to about 5 weight percent, from about 0.1 weight percent to about 4 weight percent, from about 0.1 weight percent to about 3 weight percent and from about 0.1 weight percent to about 2 weight percent of the composition.

The ink composition may have a viscosity of from about 2 cps to about 200 cps, from about 3 cps to about 100 cps, from about 4 cps to about 50 cps and from about 5 cps to about 20 cps.

The silver ink composition comprised may be produced by stabilizing the silvers nanoparticles, adding the stabilized silver nanoparticles to the solvent containing polyvinyl alcohol derivatives such as PVB resin, and depositing the ink composition on a substrate. The composition may be used to print and form metal features on a substrate.

Method of Printing and Thin-Film Substrate

The fabrication of conductive features, such as an electrically conductive element, from the silver nanoparticle composition can be carried out by depositing the composition on a substrate using any suitable liquid deposition technique at any suitable time prior to or subsequent to the formation of other optional layer or layers on the substrate. Thus, liquid deposition of the composition on the substrate can occur either on a substrate or on a substrate already containing layered material, for example, a semiconductor layer and/or an insulating layer.

The phrase "liquid deposition technique" refers to, for example, deposition of a composition using a liquid process such as printing or liquid coating, where the liquid is a homogeneous or heterogeneous dispersion of the silver nanoparticles in the solvent. The silver nanoparticle composition may be referred to as an ink when it is used in an inkjet printer or similar printing device to be deposited on a substrate. Examples of liquid coating processes may include, for example, spin coating, blade coating, rod coating, dip coating, and the like. Examples of printing techniques may include, for example, lithography or offset printing, gravure, flexography, screen printing, stencil printing, inkjet printing, stamping (such as microcontact printing), and the like. Liquid deposition deposits a layer or line of the composition having a thickness ranging from about 5 nanometers to about 5 millimeters, such as from about 10 nanometers to about 1000 micrometers on the substrate. The deposited silver nanoparticle composition at this stage may or may not exhibit appreciable electrical conductivity.

The silver nanoparticles can be spin-coated from the silver nanoparticle ink composition, for example, for about 10 seconds to about 1000 seconds, for about 50 seconds to about 500 seconds or from about 100 seconds to about 150 seconds, onto a substrate at a speed, for example, from about 100 revolutions per minute ("rpm") to about 5000 rpm, from about 500 rpm to about 3000 rpm and from about 500 rpm to about 2000 rpm.

The substrate upon which the silver metal features are deposited may be any suitable substrate, including, for example, silicon, glass plate, plastic film, sheet, fabric, or paper. For structurally flexible devices, plastic substrates, such as for example polyester, polycarbonate, polyimide sheets and the like may be used. The thickness of the substrate may be from amount 10 micrometers to over 10 millimeters with an exemplary thickness being from about 50 micrometers to about 2 millimeters, especially for a flexible plastic substrate and from about 0.4 to about 10 millimeters for a rigid substrate such as glass or silicon.

Heating the deposited composition at a temperature of, for example, at or below about 200° C., such as, for example, from about 80° C. to about 200° C., from about 80° C. to about 180° C., from about 80° C. to about 160° C., from about 100° C. to about 140° C. and from about 100° C. to about 120° C. induces the silver nanoparticles to "anneal" and thus forms an electrically conductive layer, which is suitable for use as an electrically conductive element in electronic devices. The heating temperature is one that does not cause adverse changes in the properties of previously deposited layer(s) or the substrate (whether single layer substrate or multilayer substrate). Also, the low heating temperatures described above allow the use of low cost plastic substrates, which have an annealing temperature below 200° C.

The heating can be performed for a time ranging from, for example, 0.01 second to about 10 hours and from about 10 seconds to 1 hour. The heating can be performed in air, in an inert atmosphere, for example, under nitrogen or argon, or in a reducing atmosphere, for example, under nitrogen containing from 1 to about 20 percent by volume hydrogen. The heating can also be performed under normal atmospheric pressure or at a reduced pressure of, for example, from about 1000 mbars to about 0.01 mbars.

As used herein, the term "heating" encompasses any technique(s) that can impart sufficient energy to the heated material or substrate to (1) anneal the silver nanoparticles and/or (2) remove the optional stabilizer from the silver nanoparticles. Examples of heating techniques may include thermal heating (for example, a hot plate, an oven, and a burner), infra-red ("IR") radiation, a laser beam, flash light, microwave radiation, or UV radiation, or a combination thereof.

Heating produces a number of effects. Prior to heating, the layer of the deposited silver nanoparticles may be electrically insulating or with very low electrical conductivity, but heating results in an electrically conductive layer composed of annealed silver nanoparticles, which increases the conductivity. In embodiments, the annealed silver nanoparticles may be coalesced or partially coalesced silver nanoparticles. In embodiments, it may be possible that in the annealed silver nanoparticles, the silver nanoparticles achieve sufficient particle-to-particle contact to form the electrically conductive layer without coalescence.

In embodiments, after heating, the resulting electrically conductive line that has a thickness ranging, for example, from about 5 nanometers to about 5 microns, from about 10 nanometers to about 2 microns, from about 50 nanometers to about 300 nanometers microns, from about 50 nanometers to about 200 nanometers and from about 50 nanometers to about 150 nanometers.

The conductivity of the resulting metal element produced by heating the deposited silver nanoparticle composition is, for example, more than about 100 Siemens/centimeter ("S/cm"), more than about 1000 S/cm, more than about 2,000 S/cm, more than about 5,000 S/cm, or more than about 10,000 S/cm or more than 50,000 S/cm.

The resulting elements can be used as electrodes, conductive pads, interconnect, conductive lines, conductive tracks, and the like in electronic devices such as thin film transistors, organic light emitting diodes, RFID (radio frequency identification) tags, photovoltaic, displays, printed antenna and other electronic devices which require conductive elements or components.

In yet other embodiments, there is provided a thin film transistor comprising:
(a) an insulating layer;
(b) a gate electrode;
(c) a semiconductor layer;
(d) a source electrode; and
(e) a drain electrode,
wherein the insulating layer, the gate electrode, the semiconductor layer, the source electrode, and the drain electrode are in any sequence as long as the gate electrode and the semiconductor layer both contact the insulating layer, and the source electrode and the drain electrode both contact the semiconductor layer, and wherein at least one of the source electrode, the drain electrode, and the gate electrode are formed by: providing a silver ink composition a silver nanoparticle particle solution including silver nanoparticles and a stabilizer, a solvent and a polyvinyl alcohol derivative resin of Formula (1)

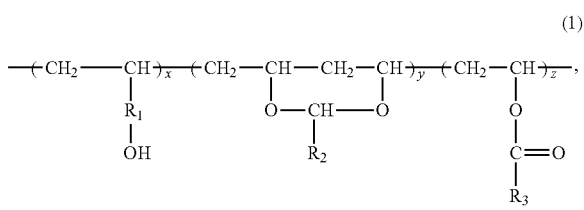

wherein $R_1$ is a chemical bond or a divalent hydrocarbon linkage having from about 1 to about 20 carbons; $R_2$ and $R_3$ are independently an alkyl, an aromatic or substituted aromatic group having from about 1 to about 20 carbon atoms; x, y and z represent the proportion of the corresponding repeat units respectively expressed as a weight percent, wherein each repeat unit is randomly distributed along polymer chain, and the sum of x, y and z is about 100 weight percent, wherein polyvinyl alcohol derivative resin is present in an amount of from 0.1 to about 5 weight percent of the composition, and wherein the viscosity of the silver ink composition is from about 2 cps to about 200 cps, depositing the silver ink composition onto the substrate to form deposited features, and heating the deposited features on the substrate to a temperature from about 80° C. to about 160° C. to form conductive silver features on the substrate.

A gate electrode, a source electrode, and a drain electrode may thus be fabricated by embodiments herein. The thickness of the gate electrode layer ranges for example from about 10 nm to about 2000 nm. Typical thicknesses of source and drain electrodes are, for example, from about 40 nm to about 1 micrometer with the more specific thickness being about 60 nm to about 400 nm.

The insulating layer generally may be an inorganic material film or an organic polymer film. Examples of inorganic materials suitable as the insulating layer may include, for example, silicon oxide, silicon nitride, aluminum oxide, barium titanate, barium zirconium titanate and the like. Illustrative examples of organic polymers for the insulating layer may include, for example, polyesters, polycarbonates, poly (vinyl phenol), polyimides, polystyrene, poly(methacrylate)s, poly(acrylate)s, epoxy resin and the like. The thickness of the insulating layer is, for example from about 10 nm to about 500 nm depending on the dielectric constant of the dielectric material used. An exemplary thickness of the insulating layer is from about 100 nm to about 500 nm. The insulating layer may have a conductivity that is, for example, less than about $10^{-12}$ S/cm.

Situated, for example, between and in contact with the insulating layer and the source/drain electrodes is the semiconductor layer wherein the thickness of the semiconductor layer is generally, for example, about 10 nm to about 1 micrometer, or about 40 to about 100 nm. Any semiconductor material may be used to form this layer. Exemplary semiconductor materials include regioregular polythiophene, oligothiophene, pentacene, and the semiconductor polymers disclosed in U.S. Publication No. 2003/0160230 A1; U.S. Publication No. 2003/0160234 A1; U.S. Publication No. 2003/0136958 A1; the disclosures of which are totally incorporated herein by reference. Any suitable technique may be used to form the semiconductor layer. One such method is to apply a vacuum of about $10^{-5}$ torr to $10^{-7}$ torr to a chamber containing a substrate and a source vessel that holds the compound in powdered form, and heat the vessel until the compound sublimes onto the substrate. The semiconductor layer can also generally be fabricated by solution processes such as spin coating, casting, screen printing, stamping, or jet printing of a solution or dispersion of the semiconductor.

The insulating layer, the gate electrode, the semiconductor layer, the source electrode, and the drain electrode are formed in any sequence, particularly where in embodiments the gate electrode and the semiconductor layer both contact the insulating layer, and the source electrode and the drain electrode both contact the semiconductor layer. The phrase "in any sequence" includes sequential and simultaneous formation. For example, the source electrode and the drain electrode can be formed simultaneously or sequentially. The composition, fabrication, and operation of thin film transistors are described in U.S. Pat. No. 6,107,117, the disclosure of which is totally incorporated herein by reference.

In embodiments, at least one of the gate, source or drain electrode in a thin-film transistor is formed by using a method described herein to form conductive features on a substrate, providing a composition containing silver nanoparticles stabilized by an organoamine compound; depositing the organoamine-stabilized silver nanoparticle onto the substrate, wherein during the deposition or following the deposition of the organoamine-stabilized silver nanoparticle onto the substrate, and removing the stabilizer, at a temperature below about 200° C., to form conductive features on the substrate.

Embodiments herein are further illustrated by way of the following examples. All percentages and parts are by weight unless otherwise indicated. Room temperature refers to a temperature ranging for example from about 20° C. to about 25° C.

EXAMPLES

Preparation of Stabilized Silver Nanoparticles

The stabilized silver nanoparticles were prepared by adding 20 grams of silver acetate to a heated dodecylamine (111 g) in a reaction flask at about 60-65° C. The mixture was then stirred until the silver acetate was completely dissolved. Subsequently, the temperature of mixture was reduced to about 55° C. and about 7.12 grams of phenylhydrazine was added to the mixture to form a resulting mixture, which was stirred for about one hour at 55° C. Next, the temperature of resulting mixture was reduced to about 40-45° C. and methanol about 400 ml were added to the resulting mixture and stirred for about 10 minutes. The product was collected by filtration, rinsed with methanol and then dried in an vacuum oven at room temperature overnight. The final product contains about 81 weight percent silver and about 19 weight percent dodecylamine as the stabilizer.

Example 1

An ink composition was prepared by adding 0.2 grams of a 2 weight percent solution of polyvinyl butyral resin (PVB) in terpineol (polyvinyl alcohol content: 11.5 to 13.5 by weight percent; polyvinyl acetate content: 0-2.5 by weight percent; polyvinyl butyral content: about 88 by weight with molecular weight from about 90,000 to 120,000) to a mixture of 0.4 grams of dodecylamine stabilized silver nanoparticles, 0.4 grams of decalin, and 0.06 grams of octadecene. The ink composition, containing about 37.4 weight percent silver nanoparticles and about 1 weight percent PVB resin (relative to the amount of silver nanoparticles), was mixed well by vigorous shaking using a Minishaker (IKA MS3) and then filtered with 0.45 μm Sigma Aldrich ACRODISC syringe filter. The filtered ink composition was printed on a glass slide using a Dimatix DMP-2800 inkjet printer equipped with a 10 μL cartridge to form featured lines of silver nanoparticles. The featured lines of silver nanoparticles were heated in an oven at a temperature from about 110 to 115° C. for about 10 minutes to anneal the silver nanoparticles, and form featured conductive lines with an average thickness of approximately 186 nm and an average width of 57 um. The average conductivity of the annealed silver lines was $8 \times 10^4$ S/cm, as measured by KEITHLEY Interactive Test Environment (two terminal resistor I-V method).

Example 2

The same ink composition prepared for Example 1 was printed on a polyethylene terephthalate (PET) using a Dimatix DMP-2800 inkjet printer equipped with 10 pL cartridges to form featured lines of silver nanoparticles. The thin featured lines of silver nanoparticles were heated in an oven at a temperature from about 110 to 115° C. for about 10 minutes to form conductive lines with an average thickness of approximately 155 nm and an average width of 86 μm. The average conductivity of the annealed silver lines was $6 \times 10^4$ S/cm, as measured by KEITHLEY Interactive Test Environment (Two Terminal Resistor I-V method).

Comparative Example

The ink composition of the Comparative Example was prepared by mixing silver nanoparticle powders produced from the same batch as above Example 1. However, the ink composition of the Comparative Example did not contain any PVB resin. The ink composition was then printed on a glass substrate in the same manner and under the same conditions described above for Example 1.

Adhesion Testing Results

Results of Adhesion Test for Examples 1-2

Figure 2:
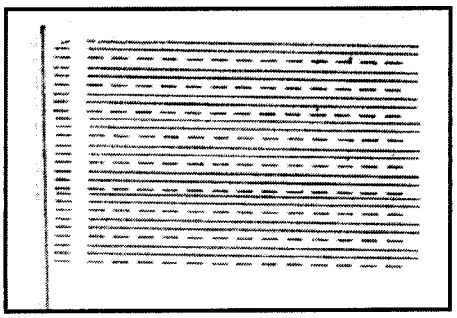
FIG. 2 is a photograph of the printed conductive line of Example 1 after the tape is applied.
Figure 3:
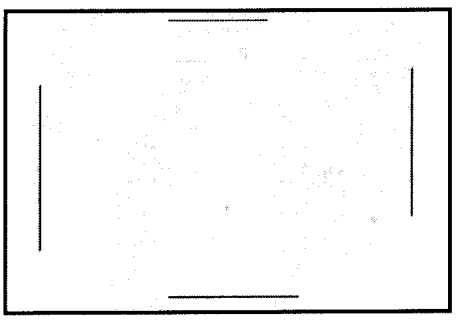
FIG. 3 is a photograph of the tape after the tape is removed from the printed conductive line of Example 1.
Figure 4:
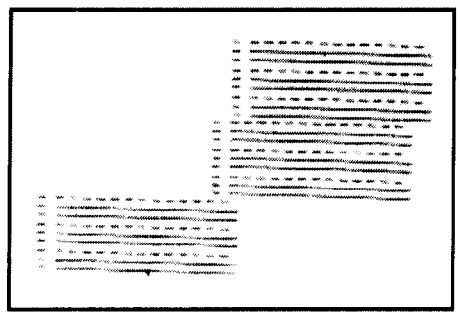
FIG. 4 is a photograph of the printed conductive line of Example 2 before the tape is applied.
Figure 5:
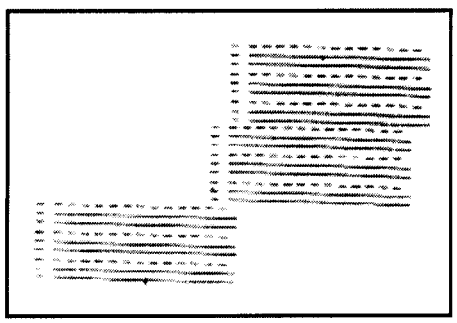
FIG. 5 is a photograph of the printed conductive line of Example 2 after the tape is applied.
Figure 6:
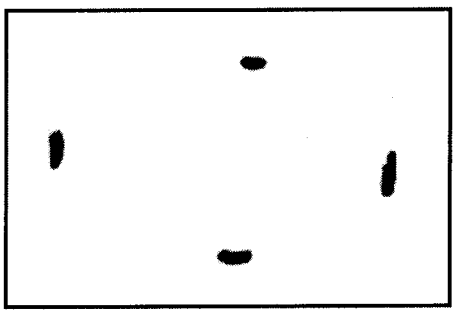
FIG. 6 is a photograph of the tape after the tape is removed from the printed conductive line of Example 2.
Figure 7:
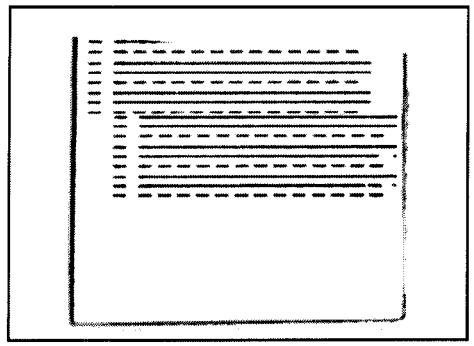
FIG. 7 is a photograph of the printed conductive line of the Comparative Example before the tape is applied.

The adhesion of the silver nanoparticles of Examples 1-2 was tested by placing a piece of 3M SCOTCH (¾ inch wide, 1 inch long) tape on the substrate with annealed silver conductive lines (FIG. 2 and FIG. 5, respectively). As shown in FIG. 3 (Example 1) and FIG. 6 (Example 2), after the tape was peeled off, the annealed silver nanoparticle film of Examples 1-2 remained intact. The annealed silver conductive lines of Example 1 and Example 2 remained conductive after the tape was removed.

Results of Adhesion Test for Comparative Example 1

Figure 8:
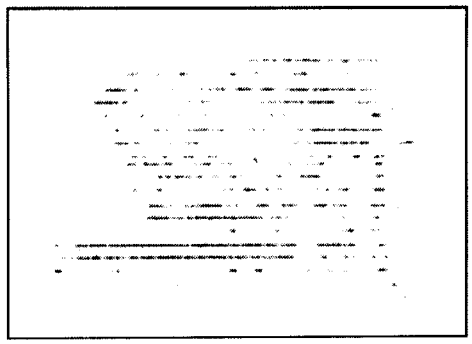
FIG. 8 is a photograph of the printed conductive line of the Comparative Example after the tape is applied.
Figure 9:
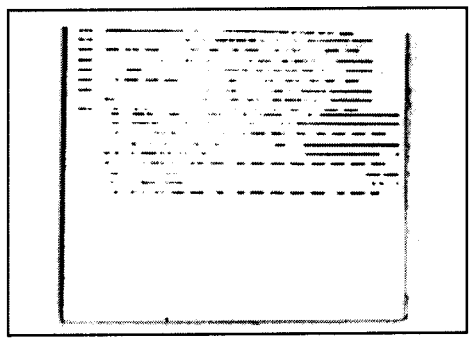
FIG. 9 is a photograph of the tape after the tape is removed from the printed conductive line of the Comparative Example.

The adhesion of the silver nanoparticles of Comparative Example 1 was tested by placing a piece of 3M SCOTCH (¾ inch wide, 1 inch long) tape on the substrate with annealed silver conductive lines (FIG. 8). As shown in FIG. 9, after the tape was peeled off, a significant amount of the annealed silver lines of Comparative Example 1 was removed from the substrate and attached to the tape (FIG. 9).

Additional Adhesion Testing—LintView Solid Ink Adhesion Tester

Additional adhesion testing was performed using a LintView Solid Ink Adhesion Tester. The LintView tester used a certified, calibrated low tack 400 NWS 400 Tape to determine the amount of the annealed silver lines that were removed from the surface of the prints when the prints are contacted with a tape at a constant pressure. The charge-coupled device (CCD) Camera inside the LintView Tester photographs the images on the tape with the silver ink particles transferred from the surface of the prints and the software analyzes and calculates the particle size and the particle size distribution of the removed silver lines. The results in below Table 1 are reported as LN Index. The worse the solid ink adhesion, the higher the LN index.

Examples 3-5

The ink composition as described above in Example 1 was printed on three PET substrates (2 inches×1 inches) using Dimatix DMP-2800 inkjet printer equipped with a 10 pL cartridge to form featured lines of silver nanoparticles. These three samples are herein referred to as Examples 3-5. The featured lines of silver nanoparticles were heated in an oven at a temperature of about 110° C.-115° C. for about 10 minutes to form featured conductive lines with an average thickness of approximately 185 nm and an average width of 62 um.

The adhesion test was done by first applying a piece of certified and calibrated NWS 400 tape (C-2) to the surface of the substrate with the printed conductive featured lines and then the tape was peeled off. The peeled tapes were evaluated by the LintView tester to determine how much of the annealed silver lines were removed from the printed surface.

Comparative Examples 2-4

The ink composition as described above in Comparative Example 1 was printed on three PET substrates via the same manner and under the same conditions described above in Examples 3-5. These three samples are herein referred to as Comparative Examples 2-4. The adhesion results for Examples 3-5 and Comparative Examples 2-4 are summarized below Table 1.

TABLE 1

| | LintView Adhesion Test Results | | | | | |
|---|---|---|---|---|---|---|
| | Example 3 | Example 4 | Example 5 | Comparative Example 2 | Comparative Example 3 | Comparative Example 4 |
| LV Index | 1.3 | 0.6 | 0.9 | 32.9 | 14.1 | 23.1 |
| Average LV Index | | 0.9 | | | 23.3 | |

As shown above in Table 1, the average LV index value obtained from the three comparative examples (Comparative Examples 2-4) is 23.3. Furthermore, the average LV index value obtained from the three examples (Examples 3-5) printed was 0.9, which was about 25 times less than that the LV index value obtained from the comparative examples.

It will be appreciated that various of the above-disclosed and other features and functions, or alternatives thereof, may be desirably combined into many other different systems or applications. Also, various presently unforeseen or unanticipated alternatives, modifications, variations or improvements therein may be subsequently made by those skilled in the art, and are also intended to be encompassed by the following claims.

What is claimed is:

1. A conductive ink composition comprising organic-stabilized silver nanoparticles and a solvent, and a polyvinyl alcohol derivative resin of Formula (1)

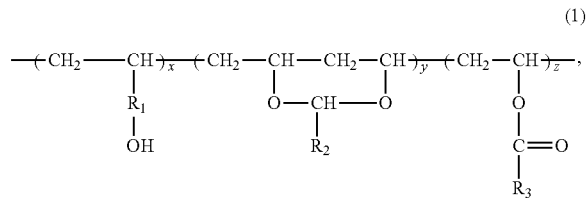

wherein $R_1$ is a chemical bond or a divalent hydrocarbon linkage having from about 1 to about 20 carbons; $R_2$ and $R_3$ are independently an alkyl, an aromatic or substituted aromatic group having from about 1 to about 20 carbon atoms; x, y and z represent the proportion of the corresponding repeat units respectively expressed as a weight percent, wherein each repeat unit is randomly distributed along polymer chain, wherein x is from about 5 to about 15, y is from about 80 to about 95 and z is from 0 to about 5, and the sum of x, y and z is about 100 weight percent, and wherein the polyvinyl alcohol derivative resin is present in an amount of from 0.1 to about 5 weight percent of the ink composition.

2. The conductive ink composition of claim 1, wherein a viscosity of the ink composition is from about 2 cps to about 200 cps.

3. The conductive ink composition of claim 1, wherein y is at least about 88.

4. The conductive ink composition of claim 1, wherein $R_1$ is a covalent chemical bond, $R_2$ is a propyl group, and $R_3$ is a methyl group.

5. The conductive ink composition of claim 1, wherein $R_1$ is a single chemical bond, and $R_2$ and $R_3$ are each an alkyl group having from about 1 to about 20 carbon atoms.

6. The conductive ink composition of claim 1, Wherein the stabilizer for the silver nanoparticles is an organoamine stabilizer selected from the group consisting of butylamine, pentylamine, hexylamine, heptylamine, octylamine, nonylamine, decylamine, hexadecylamine, undecylamine, dodecylamine, tridecylamine, tetradecylamine, diaminopentane, diaminohexane, diaminoheptane, diaminooctane, diaminononane, diaminodecane, diaminooctane, dipropylamine, dibutylamine, dipentylamine, dihexylamine, diheptylamine, dioctylamine, dinonylamine, didecylamine, methylpropylamine, ethylpropylamine, propylbutylamine, ethylbutylamine, ethylpentylamine, propylpentylamine, butylpentylamine, tributylamine, trihexylamine and mixtures thereof.

7. The conductive ink composition of claim 1, wherein the stabilizer for the silver nanoparticles is dodecylamine.

8. The conductive ink composition of claim 1, wherein the solvent is selected from the group consisting of an aromatic hydrocarbon solvent, an isoparaffinic hydrocarbon solvent, naphthenic oils, an alcohol, an alkane or an alkene comprised of from about 8 to about 18 carbon atoms and mixtures thereof.

9. The conductive ink composition of claim 1, herein the solvent is a mixture comprised of at least one alcohol selected from the group consisting of terpineol, hexanol, heptanol, cyclohexanol and 3,7-dimethylocta-2,6-dien-1ol, 2 (2 propyl)-5-methyl-cyclohexane-1-ol, and at least one hydrocarbon solvent selected from the group consisting of decalin, hexadecane, hexadecene and 1,2,4-trimethylbenzene.

10. The conductive ink composition of claim 1, wherein the solvent is present in the silver ink composition in an amount from about 10 to about 90 percent by weight of the silver ink composition.

11. The conductive ink composition of claim 1, wherein the organic-stabilized silver nanoparticles in the ink composition are present in an amount from about 20 to about 80 weight percent.

12. A conductive ink composition comprising a silver nanoparticle solution including organic-stabilized silver nanoparticles, a solvent, and a polyvinyl alcohol derivative resin of Formula (1)

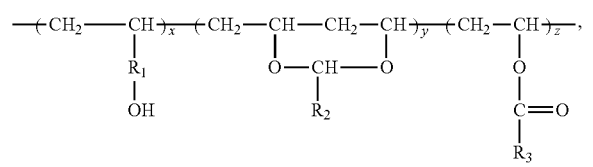

(1)

wherein $R_1$ is a chemical bond or a divalent hydrocarbon linkage having from about 1 to about 20 carbons; $R_2$ and $R_3$ are independently an alkyl, an aromatic or substituted aromatic group having from about 1 to about 20 carbon atoms; x, y and z represent h proportion of the corresponding repeat units respectively expressed as a weight percent, wherein each repeat unit is randomly distributed along polymer chain, wherein x is about 5 to about 25, y is from about 75 to about 95 and z is from 0 to about 10, and the sum of x, y and z is about 100 weight percent, wherein the polyvinyl alcohol derivative resin is present in an amount of from 0.1 to about 5 weight percent of the ink composition, and wherein the polyvinyl alcohol derivative resin has a weight average molecular weight of from about 50,000 to about 250,000 Daltons.

13. The conductive ink composition of claim 12, Wherein the stabilizer for the silver nanoparticles is an organoamine stabilizer selected from the group consisting of butylamine, pentylamine, hexylamine, heptylamine, octylamine, nonylamine, decylamine, hexadecylamine, undecylamine, dodecylamine, tridecylamine, tetradecylamine, diaminopentane, diaminohexane, diaminoheptane, diaminooctane, diaminononane, diaminodecane, diaminooctane, dipropylamine, dibutylamine, dipentylamine, dihexylamine, diheptylamine, dioctylamine, dinonylamine, didecylamine, methylpropylamine, ethylpropylamine, propylbutylamine, ethylbutylamine, ethylpentylamine, propylpentylamine, butylpentylamine, tributylamine, trihexylamine and mixtures thereof.

14. The conductive ink composition of claim 12, wherein the solvent is selected from the group consisting of an aromatic hydrocarbon solvent, an isoparaffinic hydrocarbon solvent, naphthenic oils, an alcohol, an alkane or an alkene comprised of from about 8 to about 18 carbon atoms and mixtures thereof.

15. The conductive ink composition of claim 12, wherein the solvent is a mixture comprised of at least one alcohol selected from the group consisting of terpineol, hexanol, heptanol, cyclohexanol and 3,7-dimethylocta-2,6-dien-1ol, 2 (2 propyl)-5-methyl-cyclohexane-1-ol, and at least one hydrocarbon solvent selected from the group consisting of decalin, hexadecane, hexadecene and 1,2,4-trimethylbenzene.

16. A method of forming conductive features on a substrate, the method comprising:
providing a silver ink composition comprised of a silver nanoparticle particle solution including organic-stabilized silver nanoparticles, a solvent and polyvinyl alcohol derivative resin of Formula (1)

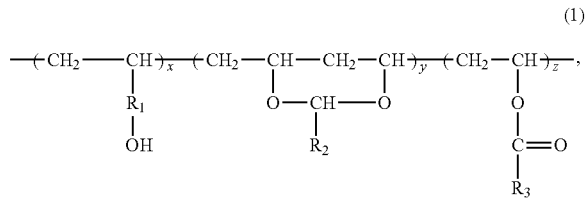

(1)

wherein $R_1$ is a chemical bond or a divalent hydrocarbon linkage having from about 1 to about 20 carbons; $R_2$ and $R_3$ are independently an alkyl, an aromatic or substituted aromatic group having from about 1 to about 20 carbon atoms; x, y and z represent the proportion of the corresponding repeat units respectively expressed as a weight percent, wherein each repeat unit is randomly distributed along polymer chain, wherein is x from about 5 to about 15, y is from about 80 to about 95 and z is from 0 to about 5, and the sum of x, y and z is about 100 weight percent, and wherein the polyvinyl alcohol derivative resin is present in an amount of from 0.1 to about 5 weight percent of the silver ink composition, depositing the silver ink composition onto the substrate to form deposited features, and heating the deposited features on the substrate to a temperature from about 80° C. to about 160° C. to form conductive silver features on the substrate.

17. The method of claim 16, wherein the stabilizer for the silver nanoparticles is an organoamine stabilizer selected from the group consisting of butylamine, pentylamine, hexylamine, heptylamine, octylamine, nonylamine, decylamine, hexadecylamine, undecylamine, dodecylamine, tridecylamine, tetradecylamine, diaminopentane, diaminohexane, diaminoheptane, diaminooctane, diaminononane, diaminodecane, diaminooctane, dipropylamine, dibutylamine, dipentylamine, dihexylamine, diheptylamine, dioctylamine, dinonylamine, didecylamine, methylpropylamine, ethylpropylamine, propylbutylamine, ethylbutylamine, ethylpentylamine, propylpentylamine, butylpentylamine, tributylamine, trihexylamine and mixtures thereof.

18. The method of claim 16, wherein the stabilizer for the silver nanoparticles is dodecylamine.

19. The method of claim 16, wherein the solvent is selected from the group consisting of an aromatic hydrocarbon solvent, an isoparaffinic hydrocarbon solvent, naphthenic oils, an alcohol, an alkane or an alkene comprised of from about 8 to about 18 carbon atoms and mixtures thereof.

20. The method of claim 16, wherein the depositing is select from the group consisting of spin coating, blade coating, rod coating, dip coating, lithography or offset printing, gravure, flexography, screen printing, stencil printing, inkjet printing, and stamping.

\* \* \* \* \*